US011935606B2

(12) United States Patent
Sahu et al.

(10) Patent No.: US 11,935,606 B2
(45) Date of Patent: Mar. 19, 2024

(54) MEMORY WITH SCAN CHAIN TESTING OF COLUMN REDUNDANCY LOGIC AND MULTIPLEXING

(71) Applicant: QUALCOMM Incorporated, San Diego, CA (US)

(72) Inventors: Rahul Sahu, Bangalore (IN); Sharad Kumar Gupta, Bangalore (IN); Jung Pill Kim, San Diego, CA (US); Chulmin Jung, San Diego, CA (US); Jais Abraham, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 177 days.

(21) Appl. No.: 17/364,738

(22) Filed: Jun. 30, 2021

(65) Prior Publication Data

US 2023/0005556 A1 Jan. 5, 2023

(51) Int. Cl.
*G11C 29/10* (2006.01)
*G11C 7/06* (2006.01)
*G11C 7/10* (2006.01)

(52) U.S. Cl.
CPC .............. *G11C 29/10* (2013.01); *G11C 7/06* (2013.01); *G11C 7/106* (2013.01); *G11C 7/1096* (2013.01)

(58) Field of Classification Search
None
See application file for complete search history.

(56) References Cited

U.S. PATENT DOCUMENTS

| 2011/0072323 | A1  | 3/2011 | Chong et al. |
| 2018/0033495 | A1  | 2/2018 | Ghosh et al. |
| 2018/0113821 | A1* | 4/2018 | Narasimhan ........ G06F 13/1689 |
| 2018/0238965 | A1  | 8/2018 | Anzou et al. |
| 2019/0066814 | A1  | 2/2019 | Sisodia et al. |

OTHER PUBLICATIONS

International Search Report and Written Opinion—PCT/US2022/033887—ISA/EPO—dated Dec. 12, 2022.
Partial International Search Report—PCT/US2022/033887—ISA/EPO—dated Oct. 20, 2022.

* cited by examiner

*Primary Examiner* — Guerrier Merant
(74) *Attorney, Agent, or Firm* — QUALCOMM Incorporated

(57) ABSTRACT

A memory is provided in which a scan chain covers the redundancy logic for column redundancy as well as the redundancy multiplexers in each column. The redundancy logic includes a plurality of redundancy logic circuits arranged in series. Each redundancy logic circuit corresponds to a respective column in the memory. Each column is configured to route a shift-in signal through its redundancy multiplexers during a scan mode of operation.

17 Claims, 8 Drawing Sheets

MEMORY WITH SCAN CHAIN TESTING OF COLUMN REDUNDANCY LOGIC AND MULTIPLEXING

TECHNICAL FIELD

This application relates to memories with column redundancy, and more particularly, to a memory with scan chain testing of its column redundancy logic and column redundancy multiplexing.

BACKGROUND

A memory with column redundancy will include redundancy logic that determines whether a read or write operation to a column should be shifted to an adjacent column due to a column defect. Each column includes redundancy multiplexers for the shifting of the read or write operation to the adjacent column. However, existing design-for-test (DFT) scan chains do not test for errors in the redundancy logic or in the redundancy multiplexers.

SUMMARY

A memory is provided that includes: a plurality of columns, each column including: a bit line; a complement bit line; a first read multiplexer transistor coupled to the bit line and having a read terminal; a second read multiplexer transistor coupled to the complement bit line and having a complement read terminal; a write driver having a write data output terminal and a complement write data output terminal; a scan multiplexer having a first pair of input terminals coupled to the write data output terminal and the complement write data output terminal and having a second pair of input terminals coupled to the read terminal and the complement read terminal; and a sense amplifier coupled to an output from the scan multiplexer.

A method of testing a column in a memory is provided that includes: in response to a column redundancy signal for the column being false during a scan mode of operation: responsive to a triggering edge of a scan clock signal, routing a shift-in signal through a write column redundancy multiplexer to a write driver; processing the shift-in signal through the write driver to form a pair of write driver output signals; routing the pair of write driver output signals through a scan multiplexer to a sense amplifier; sensing the pair of write driver output signals in the sense amplifier to form a sensed version of the shift-in signal; and routing the sensed version of the shift-in signal through a read column redundancy multiplexer to a data output latch.

A memory is provided that includes: a plurality of columns, each column including: a bit line; a complement bit line; a first read multiplexer transistor coupled to the bit line and having a read terminal; a second read multiplexer transistor coupled to the complement bit line and having a complement read terminal; a sense amplifier having a first input terminal coupled to the read terminal and a second input terminal coupled to the complement read terminal; a read column redundancy multiplexer having a first input terminal coupled to an output terminal of the sense amplifier and having a second input terminal coupled to a sense amplifier in an adjacent column; and a data output latch having an input terminal coupled to an output terminal of the read column redundancy multiplexer through a direct electrical connection.

A memory is provided that includes: a redundancy decoder including a gating logic gate and a fuse decoder having an enable input terminal coupled to an output terminal of the gating logic gate, the redundancy decoder further including a plurality of output terminals for a plurality of decoded address signals; a plurality of column redundancy logic circuits arranged in series, each column redundancy logic circuit having a set of input terminals for receiving a respective set of redundancy address bits and having an output terminal for a column redundancy signal; and a scan flip-flop configured to latch the column redundancy signal from a last one of the column redundancy logic circuits.

These and additional advantages may be better appreciated through the following detailed description.

BRIEF DESCRIPTION OF THE DRAWINGS

Implementations of the disclosure and their advantages are best understood by referring to the detailed description that follows. It should be appreciated that like reference numerals are used to identify like elements illustrated in one or more of the figures.

DETAILED DESCRIPTION

Figure 1:
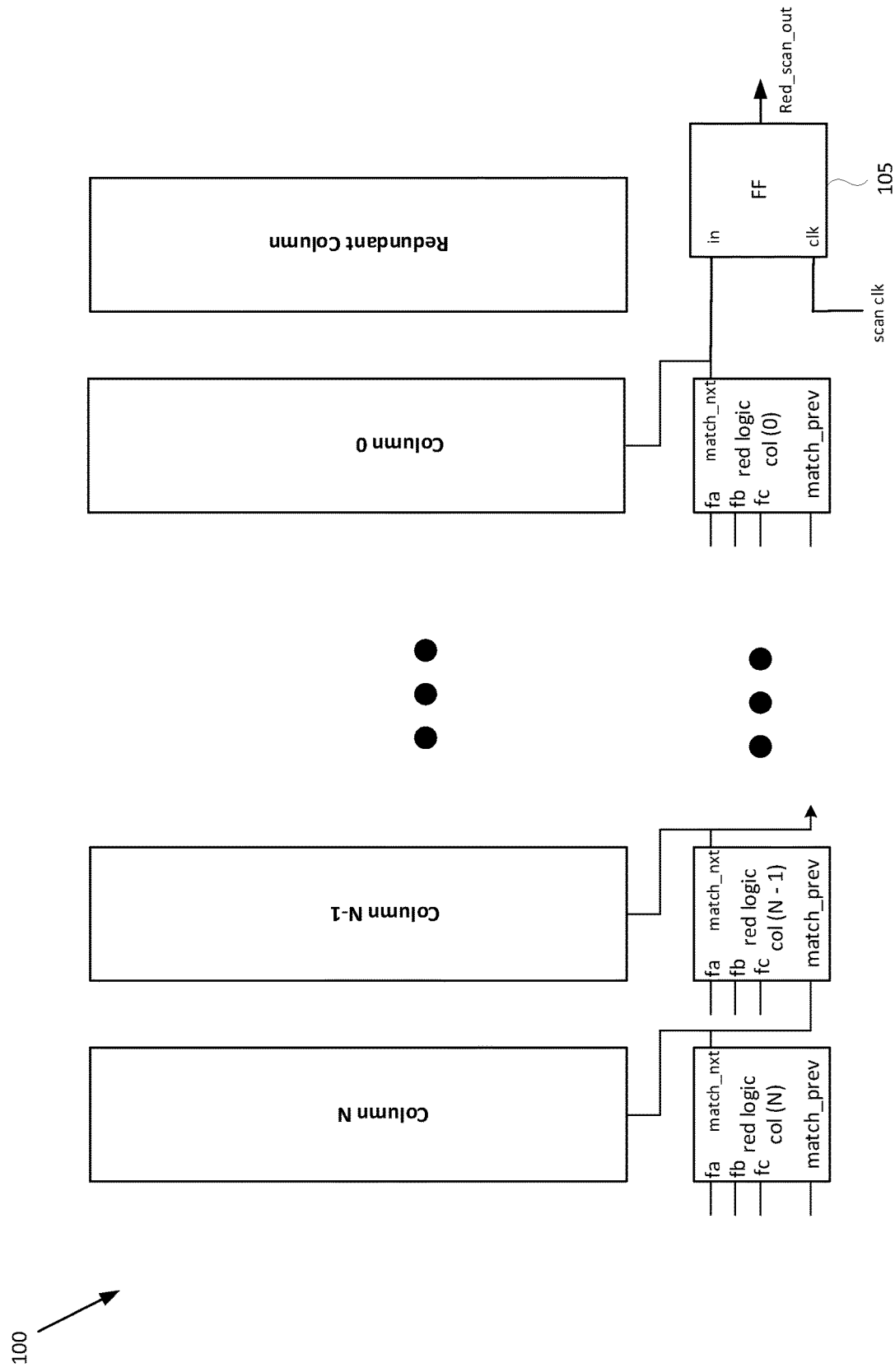
FIG. 1 is a diagram of a memory in which the redundancy logic circuits and the column redundancy multiplexers are included within a DFT scan chain in accordance with an aspect of the disclosure.

Improved column redundancy schemes are provided for memories to allow a DFT scan chain to scan for errors in the redundancy logic and in a column's redundancy multiplexers. An example memory 100 with this improved column redundancy is shown in FIG. 1. Memory 100 includes a plurality of N+1 columns of bitcells, ranging from an Nth column to a zeroth column, N being a positive integer. Memory 100 also includes at least one redundant column. For brevity, the expression "column" without any further clarification will be understood herein to refer to a non-redundant column. During testing of memory 100, it may be the case that there are no defective columns. In that case, the redundant column (or columns) is not used. A read or write operation that is addressed to a particular column will thus occur to that column. All of the columns many then be deemed to be un-shifted columns since there is no shifting as column redundancy is not enabled. But that is not the case if there is a defective column. The array of columns may then be divided into un-shifted columns and shifted columns depending upon the location of the defective column. For example, suppose that an ith column is defective. The subsequent columns from an (i+1)th column up to the (N+1) column are un-shifted whereas the preceding columns from the ith column to the zeroth column are shifted. For example, if a read or write operation is addressed to the zeroth column when column redundancy is enabled, the read or write operation actually occurs to the redundant column.

To implement column redundancy, a fuse decoder (not illustrated) may function to decode a fuse word to produce a plurality of decoded redundancy address signals. For example, the decoding may produce three decoded redundancy address signals fa<0:3>, fb<0:3>, and fc<0:3>. The number of decoded address redundancy signals and their bit width may be varied in alternative implementations. To process the decoded redundancy address signals, each column is associated with a corresponding redundancy logic circuit. There is thus an Nth redundancy logic circuit (red logic col (N)) for the Nth column, a (N−1)th redundancy logic circuit (red logic col (N−1)) for the (N−1)th column, and so on such that there is a zeroth redundancy logic circuit (red logic col (0)) for the zeroth column. Each column's redundancy logic circuit receives one bit each from the decoded redundancy address signals fa<0:3>, fb<0:3>, and fc<0:3>. Each redundancy logic circuit thus receives three redundancy address bits fa, fb, and fc.

In one implementation, the decoded redundancy address bits fa, fb, and fc are active low. The defective column is thus identified by its decoded redundancy address bits fa, fb, and fc all being logical zeroes in an active-low implementation. Alternatively, an active-high implementation may be used in which the decoded redundancy address bits fa, fb, and fc would all be logical ones. As used herein, a binary signal is deemed to be asserted when the binary logic signal is true, regardless of whether the true binary state is represented by an active-low or an active-high convention. Each redundancy logic circuit is configured to assert a column redundancy signal (designated as match_next) should its decoded redundancy address bits fa, fb, and fc be logically true (asserted). The terms "column redundancy signal" and "match_next" are used interchangeably herein. In an active-high implementation, each redundancy logic circuit is thus configured to assert its match_next signal if its bits fa, fb, and fc are all binary ones.

The redundancy logic circuits may be deemed to be arranged in series starting from the Nth redundancy logic circuit to the zeroth redundancy logic circuit. The match_next signal from a preceding redundancy logic circuit in this serial arrangement is received as a match_prev signal at the subsequent redundancy logic circuit. For example, the match_next signal from the Nth redundancy logic circuit is received by the (N−1)th redundancy logic circuit as its match_prev signal. Each redundancy logic circuit is configured to assert its match_next signal if its match_prev signal was asserted. In the example discussed earlier in which the ith column is the defective column, the ith redundancy logic circuit will thus asserts its match_next signal. The subsequent redundancy logic circuits from the (i−1)th redundancy logic circuit to the zeroth redundancy logic circuit will thus also assert their match_next signal since each of their match_prev signals will be asserted. In the following discussion, it will be assumed that the match_next signal is a logic-high signal such that it is a logical one when asserted.

Figure 2:
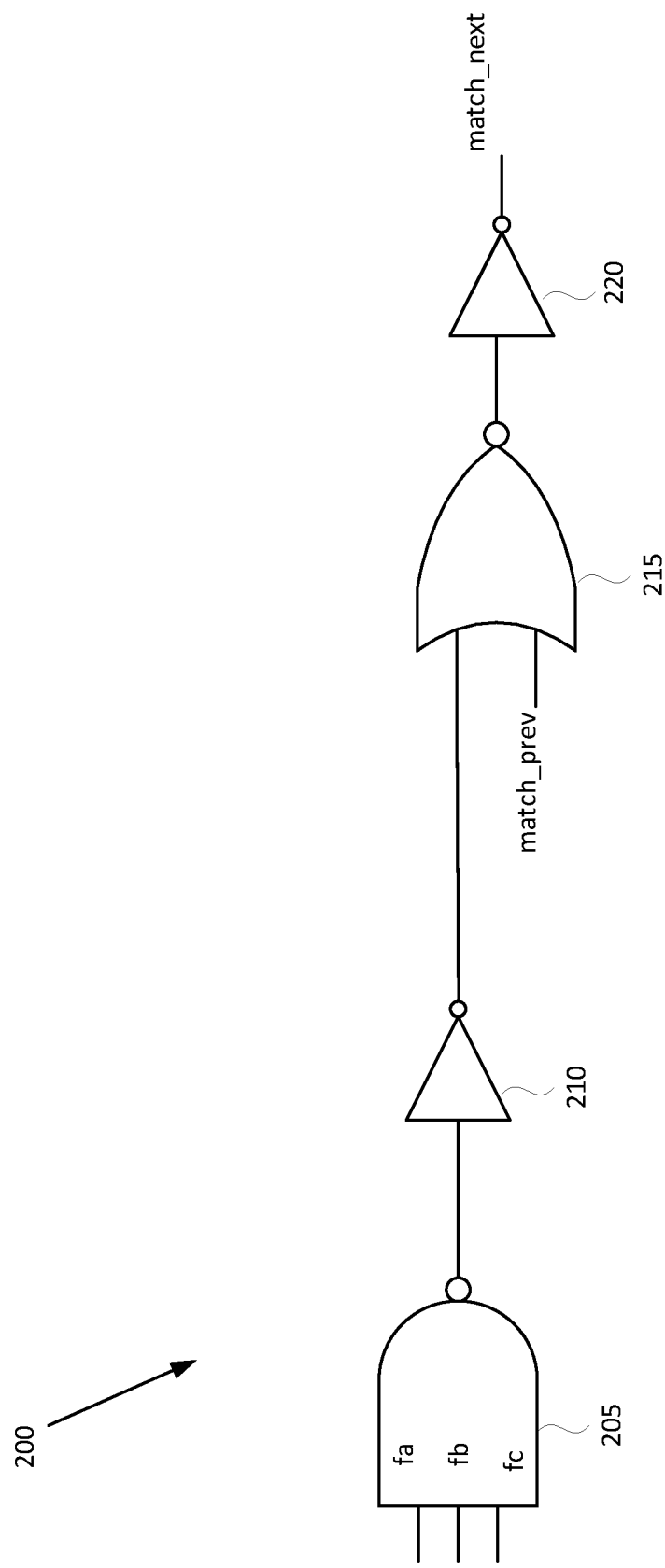
FIG. 2 is a diagram of a redundancy logic circuit in the memory of FIG. 1 in accordance with an aspect of the disclosure.

An example redundancy logic circuit 200 is shown in more detail in FIG. 2. A logic gate such as a NAND gate 205 processes the fa, fb, and fc decoded redundancy address bits to produce an output signal that is inverted by an inverter 210. A NOR gate 215 NORs an output signal from inverter 210 with the match_prev signal. An inverter 220 inverts an output signal from NOR gate 215 to produce the match_next signal. If any one of the bits fa, fb, and fc is a logical zero, the output of NAND gate 205 is a logical one. This logical one is inverted by inverter 210 to produce a logical zero to NOR gate 215. If the match_prev signal is a logical zero as well, the output of NOR gate 215 will thus be a logical one that is inverted by inverter 220 to force the match_next signal to be logical zero. However, if fa, fb, and fc bit signals are all logical ones and/or the match_prev signal is a logical one, the match_next signal is asserted.

Referring again to memory 100, note that each column receives the match_next signal from its corresponding redundancy logic circuit. As will be explained further herein, each column includes a write column redundancy multiplexer and a read column redundancy multiplexer. In a write operation to a column having an asserted match_next signal, the write column redundancy multiplexer directs the write data bit to the preceding column. For example, if the ith column has an asserted match_next signal, its write column redundancy multiplexer directs the write data bit to be written to the (i−1)th column. But if the ith column has a false match_next signal, its write column redundancy multiplexer directs the write data bit to the ith column's write driver. The read column redundancy multiplexer is analogous in that it either selects for a retrieved bit from the current column or from the preceding column depending upon whether the current column's match_next signal is true or false.

Figure 3:
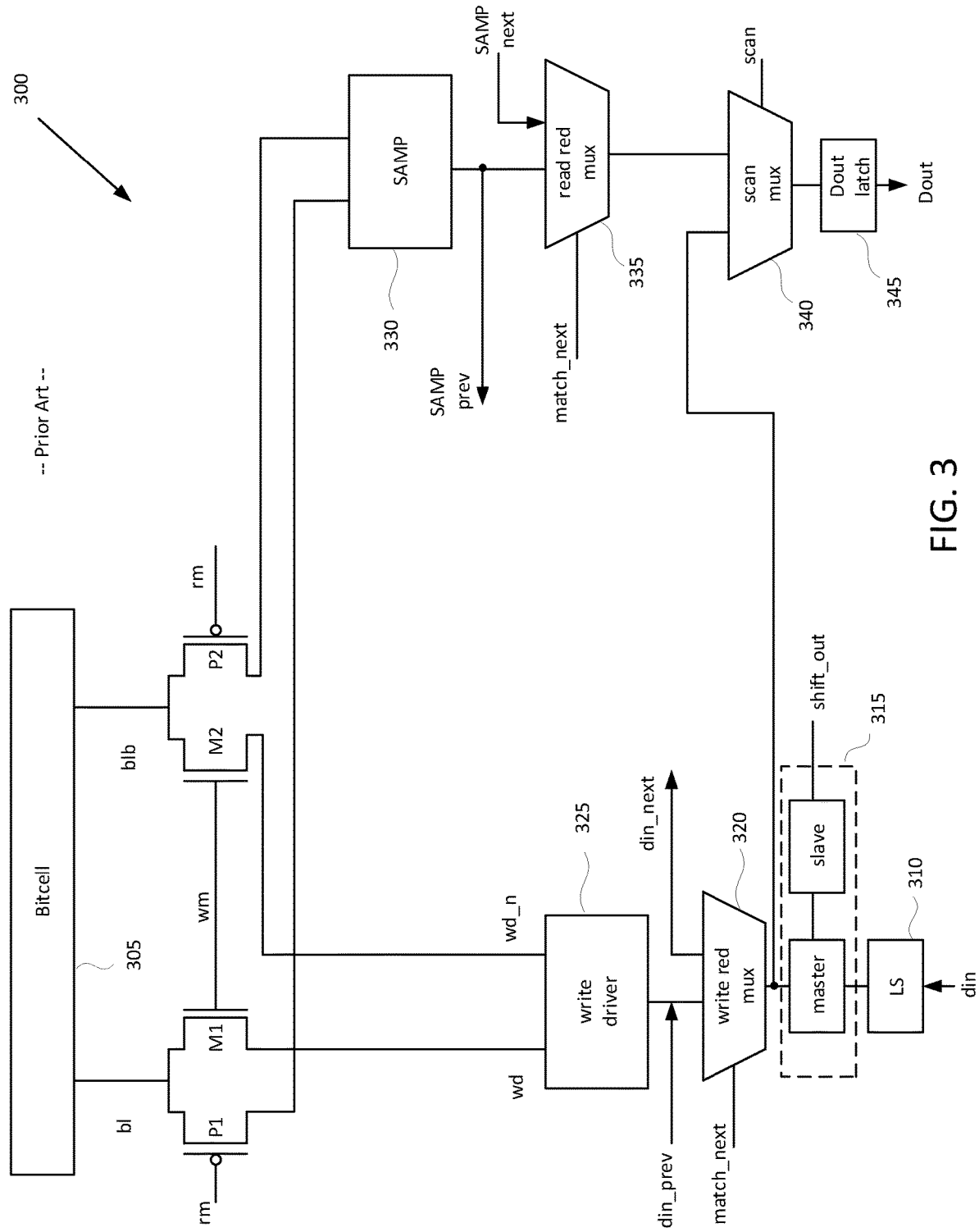
FIG. 3 is a diagram of a conventional column in which the column redundancy multiplexers are bypassed by a DFT scan chain.

In a conventional memory with column redundancy, it was typical that neither the write column redundancy multiplexer nor the read column redundancy multiplexer was covered by a DFT scan chain. An example conventional column 300 is shown in FIG. 3. For illustration clarity, just a single bitcell 305 is shown coupling to a bit line b1 and a complement bit line b1b but it will be appreciated that a column such as column 300 includes a plurality of bitcells arranged according to rows. During a write operation to column 300, an input data bit din from a core power domain powered by a core power supply is level shifted by a level-shifter (LS) 310 to a memory power supply domain din signal powered by a memory power supply. During a scan mode of operation, a shift-in signal is provided by scan chain flip-flop such as a master-slave flip-flop 315 for a scan chain. During a write operation, a write column redundancy multiplexer (write red mux) 320 routes the level-shifted din signal depending upon whether the match_next signal is asserted or de-asserted. If the match_next signal is false, write column redundancy multiplexer 320 passes the level-shifted din signal to a write driver 325. But if the match_next signal is true, write column redundancy multiplexer 320 passes the level-shifted din signal to a preceding column as a din_next signal. Should a subsequent column already have its match_next signal asserted, column 300 would receive this subsequent column's din_next signal as a din_prev signal at write driver 325. Based upon the write driver's input signal (either the level-shifted din signal in the case of no redundancy or the din_prev signal should the subsequent column have its match_next signal asserted), write driver 325 drives a write data signal (wd) and a complement write data signal (wd_n) accordingly.

During the write operation to column 300, a write multiplexer signal wm is asserted to switch on an n-type-metal-oxide-semiconductor (NMOS) write multiplexer transistor M1 to couple the wd signal to the bit line b1. Similarly, the assertion of the write multiplexer signal wm switches on another NMOS write multiplexer transistor M2 to couple the wd_n signal to the complement bit line b1b. Bitcell 305 may then be written to accordingly to complete the write operation.

During a read operation in which column 300 is not defective, an active-low read multiplexer signal rm is discharged to switch on a p-type-metal-oxide-semiconductor (PMOS) read multiplexer transistor P1 to couple the true bit line to a sense amplifier (SAMP) 330. Similarly, the discharging of the read multiplexer signal rm switches on another PMOS read multiplexer transistor P2 to couple the complement bit line b1b to SAMP 330. SAMP 330 may then make a bit decision. A read column redundancy multiplexer (read red mux) 335 selects for the bit decision from SAMP 330 should the match_next signal for column 300 be false. If the match_next signal is true, read column redundancy multiplexer 335 selects for the bit decision (SAMP next) from the preceding column. During a read operation to a subsequent column that has its match_next signal asserted, the subsequent column selects for the bit decision from SAMP 330 (SAMP prev).

During the read operation, a scan signal for a DFT scan of column 300 is not asserted. The scan signal controls a scan multiplexer (scan mux) 340 that selects for the bit decision from read column redundancy multiplexer 335 during a read operation. A data output latch (Dout latch) 345 may then latch the output data bit to complete the read operation. During a scan mode of operation, scan multiplexer 340 responds to the assertion of the scan signal by selecting for a shift-in signal from master-slave flip-flop 315. Such a conventional DFT scan thus bypasses the operation of the write column redundancy multiplexer 320 and the read column redundancy multiplexer 335.

Figure 4:
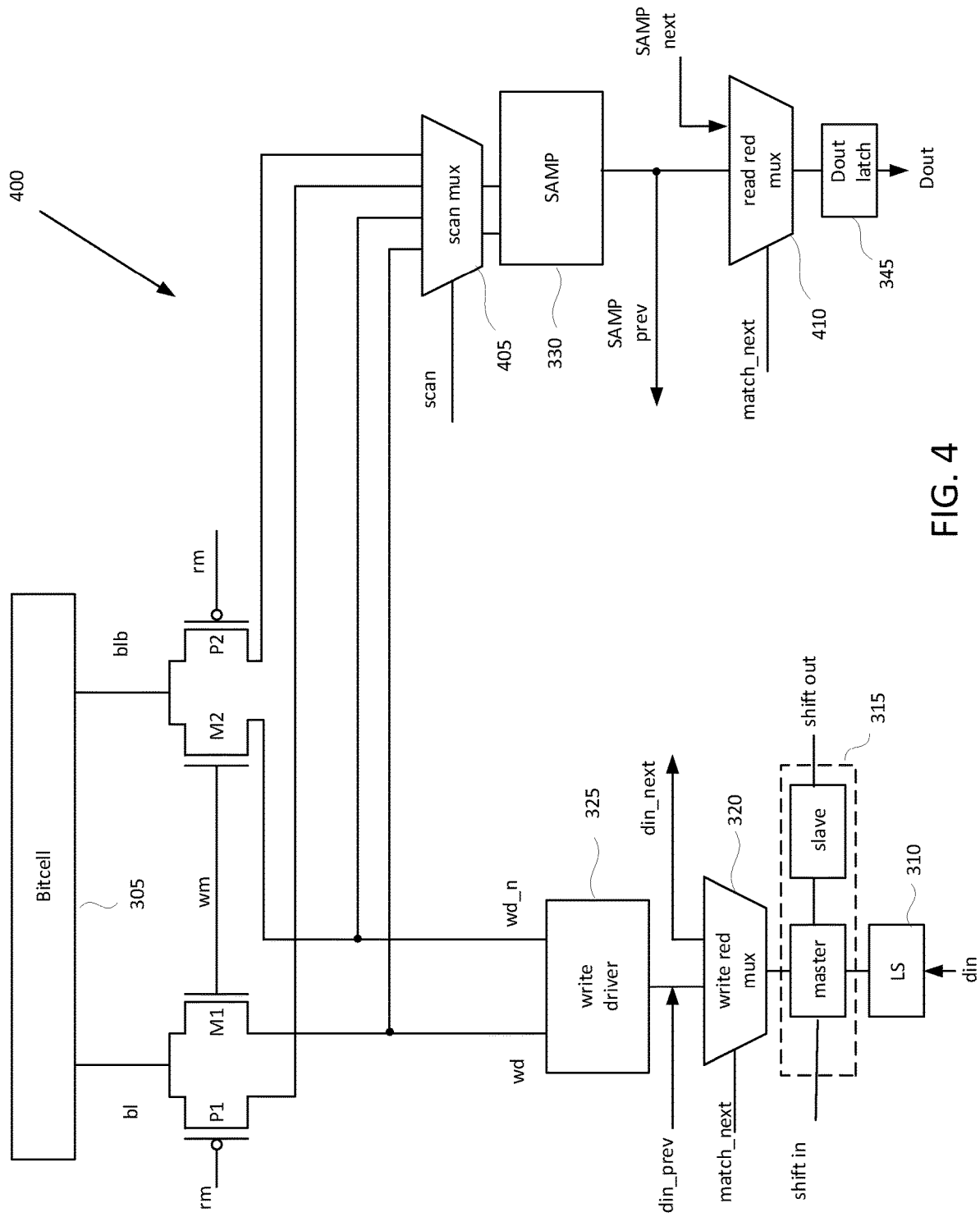
FIG. 4 illustrates a column in which the column redundancy multiplexers are included within a DFT scan chain in accordance with a first aspect of the disclosure.

To provide an ability to include the write and read column redundancy multiplexers in a DFT scan, an improved column 400 is provided as shown in FIG. 4. As discussed for column 300, just a single bitcell 305 is shown in column 400 coupling to a bit line b1 and a complement bit line b1b but it will be appreciated that column 400 includes a plurality of bitcells arranged according to rows. Referring again to memory 100, each of the columns ranging from the Nth column to the zeroth column may be implemented as shown for column 400. As also discussed analogously for column 300, an input data bit din from a core power domain powered by a core power supply is level shifted by a level shifter (LS) 310 in column 400 to a memory power supply domain din signal powered by a memory power supply during a write operation to column 400. During a scan mode of operation, a shift-in signal is provided by a master latch in a master-slave flip-flop 315 included in a scan chain. A write column redundancy multiplexer (write red mux) 320 multiplexes the level-shifted din signal depending upon whether the match_next signal is true or false. If the match_next signal for column 400 is false, write column redundancy multiplexer 320 passes the level-shifted din signal through a first output terminal to an input terminal of write driver 325 during a write operation. But if the match_next signal is true, write column redundancy multiplexer 320 passes the level-shifted din signal through a second output terminal to a preceding column as a din_next signal. Should a subsequent column already have its match_next signal asserted, column 400 would receive this subsequent column's din_next signal as a din_prev signal at write driver 325. Based upon the write driver's input signal (either the level-shifted din signal in the case of no redundancy or the din_prev signal should the subsequent column have its match_next signal asserted), write driver 325 drives a write data signal (wd) and a complement write data signal (wd_n) accordingly.

During the write operation to column 400, an active-high write multiplexer signal wm is asserted to switch on write multiplexer transistor M1 to couple the wd signal to the bit line b1 and to switch on write multiplexer transistor M2 to couple the wd_n signal to the complement bit line b1b. Bitcell 305 may then be written to accordingly to complete the write operation.

A read operation to column 400 also occurs analogously as discussed for column 300. During a read operation in which column 400 is not defective, an active-low read multiplexer signal rm is discharged to switch on read multiplexer transistors P1 and P2 to couple the true bit line and complement bit line to a scan multiplexer 405. A source of read multiplexer transistor P1 may be deemed to form a read terminal. Similarly, a source of read multiplexer transistor P2 may be deemed to form a complement read terminal. Scan multiplexer 405 includes a first pair of input terminals coupled to the read terminal and the complement read terminal. During a read operation, a scan signal is de-asserted to control scan multiplexer 405 to select for its first pair of input terminals and thus select for the bit line signals as routed through the read multiplexer transistors P1 and P2. SAMP 330 may then make a bit decision. A read column redundancy multiplexer (read red mux) 410 includes a first input terminal coupled to an output terminal of SAMP 330. Read column redundancy multiplexer 420 selects for this first input terminal to thus select for the bit decision from SAMP 330 should the match_next signal for column 400 be false. SAMP 330 also includes a second input terminal coupled to a sense amplifier in a preceding column. If the match_next signal is true, read column redundancy multiplexer 410 selects for this second input terminal to thus select for the bit decision (SAMP next) from the preceding column. A data output latch (Dout latch) 345 includes an input terminal coupled to an output terminal of read column redundancy multiplexer 410 so that data output latch 345 may then latch the output data bit to complete the read operation. During a read operation to a subsequent column that has its match_next signal asserted, the subsequent column selects for the bit decision from SAMP 330 (SAMP prev).

During a scan mode of operation, master-slave flip-flop 315 provides the shifted-in signal that is routed through the write column redundancy multiplexer 320 and write driver 325. Write driver 325 has a first output terminal for the write data signal wd (or the shifted-in signal during the scan mode) and a second output terminal for the complement write data signal wd_n (or the complement shifted-in signal during the scan mode). Scan multiplexer 405 includes a second pair of input terminals coupled to the first and second output terminals of write driver 325. Should the scan signal be asserted, scan multiplexer 405 selects for its second pair of input terminals to select for the pair of output signals from write driver 325. The sense amplifier SAMP 330 then makes a bit decision based upon the shifted-in signal. If the match_next signal is false, the shifted-in signal bit decision from SAMP 330 is routed through the read column redundancy multiplexer 410 to be latched in the Dout latch 345. Conversely, if the match_next signal is true, the read column redundancy multiplexer 410 selects for the shifted-in signal bit decision (SAMP next) from the sense amplifier in the preceding column. Advantageously, the operation of the write column redundancy multiplexer 320 may also be tested in the scan mode as the level-shifted shifted-in signal will be routed through the write column redundancy multiplexer 320 to write driver 325 (and ultimately to Dout latch 345) if the match_next signal is false. If the match_next signal is true, the shifted-in signal routes through write column redundancy multiplexer 320 to the write driver in the preceding column.

Figure 5:
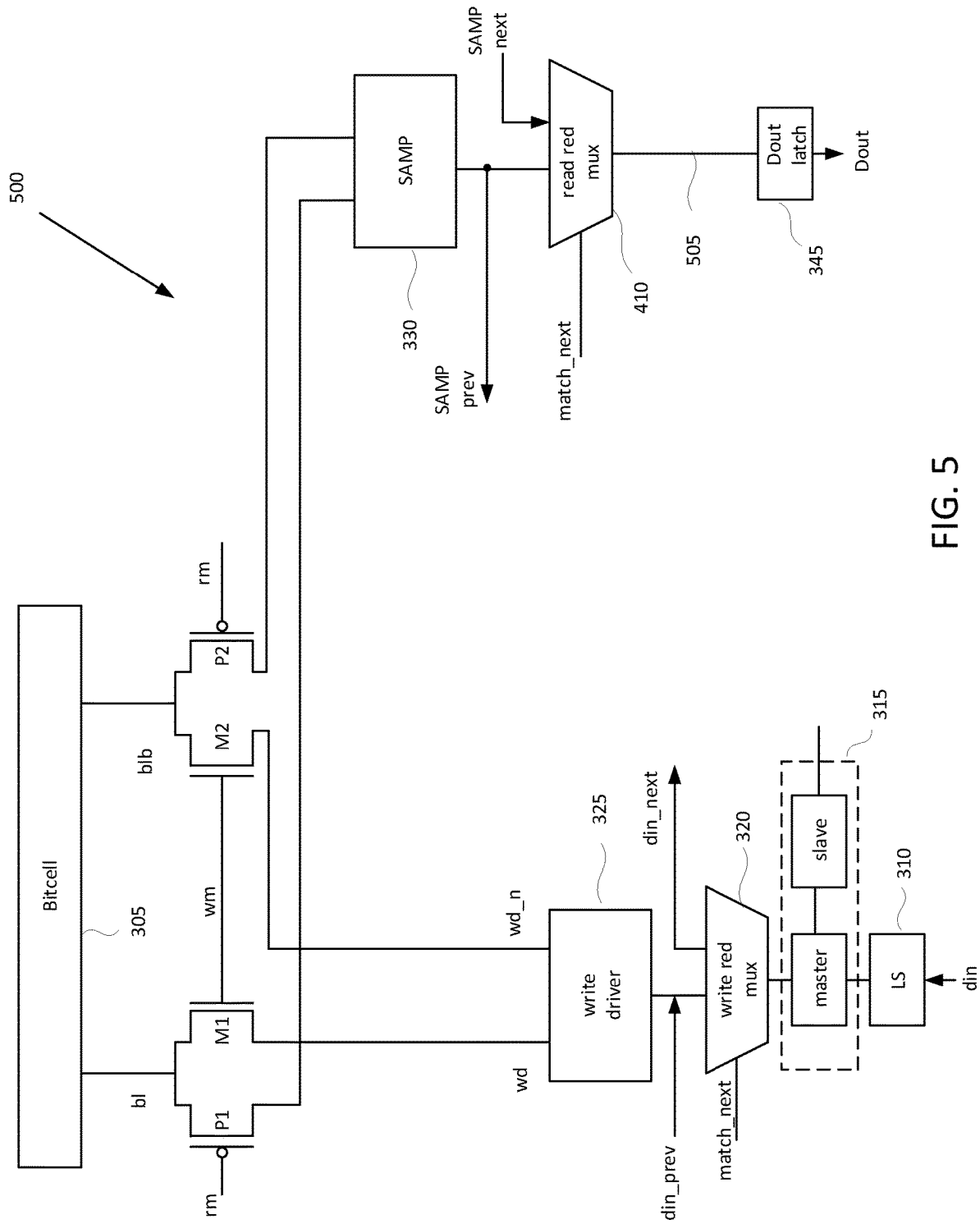
FIG. 5 illustrates a column in which the column redundancy multiplexers are included within a DFT scan chain in accordance with a second aspect of the disclosure.

An alternative column implementation that also enables the scanning of the read and write column redundancy multiplexers is shown in FIG. 5 for a column 500. Referring again to memory 100, each of the columns ranging from the Nth column to the zeroth column may be implemented as shown for column 500. Read and write operations occur analogously as discussed for column 400. For example, an input data bit din from a core power domain powered by a core power supply is level shifted by a level shifter (LS) 310 to a memory power supply domain din signal powered by a memory power supply during a write operation to column 500. During a scan mode of operation, a shifted-in signal may be provided by a master-slave flip-flop 315 for a scan chain. During a write operation, write column redundancy multiplexer (write red mux) 320 multiplexes the level-shifted din signal depending upon whether the match_next signal is true or false. If the match_next signal for column 500 is false, write column redundancy multiplexer 320 passes the level-shifted din signal to a write driver 325. But if the match_next signal is asserted for column 500, write column redundancy multiplexer 320 passes the level-shifted din signal to a preceding column as a din_next signal. Should a subsequent column already have its match_next signal asserted, column 500 may receive this subsequent column's din_next signal as a din_prev signal at write driver 325. Based upon the write driver's input signal during a write operation (either the level-shifted din signal in the case of no redundancy or the din_prev signal should the preceding column have its match_next signal asserted), write driver 325 drives a write data signal (wd) and a complement write data signal (wd_n) accordingly.

During the write operation to column 500, an active-high write multiplexer signal wm is asserted to switch on write multiplexer transistor M1 to couple the wd signal to the bit line b1 and to switch on write multiplexer transistor M2 to couple the wd_n signal to the complement bit line b1b. Bitcell 305 may then be written to accordingly to complete the write operation.

A read operation to column 500 also occurs analogously as discussed for column 400. During a read operation in which the match_next signal for column 500 is false, an active-low read multiplexer signal rm is discharged to switch on read multiplexer transistors P1 and P2 to couple the true bit line and complement bit line to sense amplifier 330. SAMP 330 may then make a bit decision. Read column redundancy multiplexer (read red mux) 410 selects for the bit decision from SAMP 330 should the match_next signal for column 500 be false. If the match_next signal is true for column 500, read column redundancy multiplexer 410 selects for the bit decision (SAMP next) from the preceding column. A data output latch (Dout latch) 345 may then latch the output data bit to complete the read operation. During a read operation to a subsequent column that has its match_next signal asserted, the subsequent column selects for the bit decision from SAMP 330 (SAMP prev).

In a scan mode of operation, a memory controller (not illustrates) switches on the read multiplexer transistors M1 and M2 simultaneously with the write multiplexer transistors P1 and P2. Master-slave flip-flop 315 provides the shift-in signal. If the match_next signal for column 500 is false, the shift-in signal passes through the write column redundancy multiplexer 320 to be driven in true and complement form as the wd and wd_n signals, respectively. The wd signal during the scan mode of operation couples through write multiplexer transistor M1 to bit line b1 and also through read multiplexer transistor P1 to drive the sense amplifier 330. Similarly, the wd_n signal couples through write multiplexer transistor M2 and read multiplexer transistor P2 to drive the sense amplifier 330 during the scan mode of operation. If the match_next signal is true during the scan mode of operation, the write column redundancy multiplexer 320 passes the shift-in signal to the write driver in the preceding column. The write multiplexer and read multiplexer transistors are both on in this preceding column as discussed for column 500.

In the scan mode of operation for column 500, sense amplifier 330 recovers the shift-in signal from the wd and wd_n signals. If the match_next signal for column 500 is false, read column redundancy multiplexer 410 selects for the recovered shift-in signal so that it may be latched in Dout latch 345. A direct electrical connection 505 extends from an output terminal of read column redundancy multiplexer 410 to an input terminal of Dout latch 345. As used herein, the term "direct electrical connection" refers to an electrical path or lead that does not contain any switching elements such as transistors within a multiplexer. If the match_next signal is false, the shift-in signal will thus pass through the write column redundancy multiplexer 320, the read column redundancy multiplexer 410, and direct electrical path 505 to be latched in Dout latch 345. A scan mode of operation may thus test the operation of both write column redundancy multiplexer 320 and read column redundancy multiplexer 410 during the scan mode of operation with the match_next signal being false. If the match_next signal is true during the scan mode of operation, the operation of the write column redundancy multiplexer 320 in column 500 and a read column redundancy multiplexer 410 in the preceding column are tested analogously. A scan mode for the redundancy logic circuits and a redundancy decoder will now be discussed.

Redundancy Logic and Decoding

It is customary for a redundancy decoder to be responsive to a redundancy enable signal. During a scan mode of operation with such a conventional redundancy decoder, the assertion of the redundancy enable signal may occur well before the assertion of the triggering edge of the scan clock signal for the DFT scan chain. Referring again to memory 100, the decoded redundancy address signals are thus presented to the redundancy logic circuits relatively early before the scan clock signal edge is asserted. The match_next signals from the various redundancy logic circuits then have ample time to settle. This is problematic as there may be a resistive path fault that will go undetected. For example, a resistive path fault may exist in one of NAND gate 205, inverters 210 and 220, or NOR gate 215 in redundancy logic circuit 200. Such a resistive path fault causes redundancy logic circuit 200 to take too much time to assert its match_next signal, which may lead to read or write errors. But such resistive path faults may not be detectable if the redundancy decoder is merely triggered by the redundancy enable signal.

Figure 6:
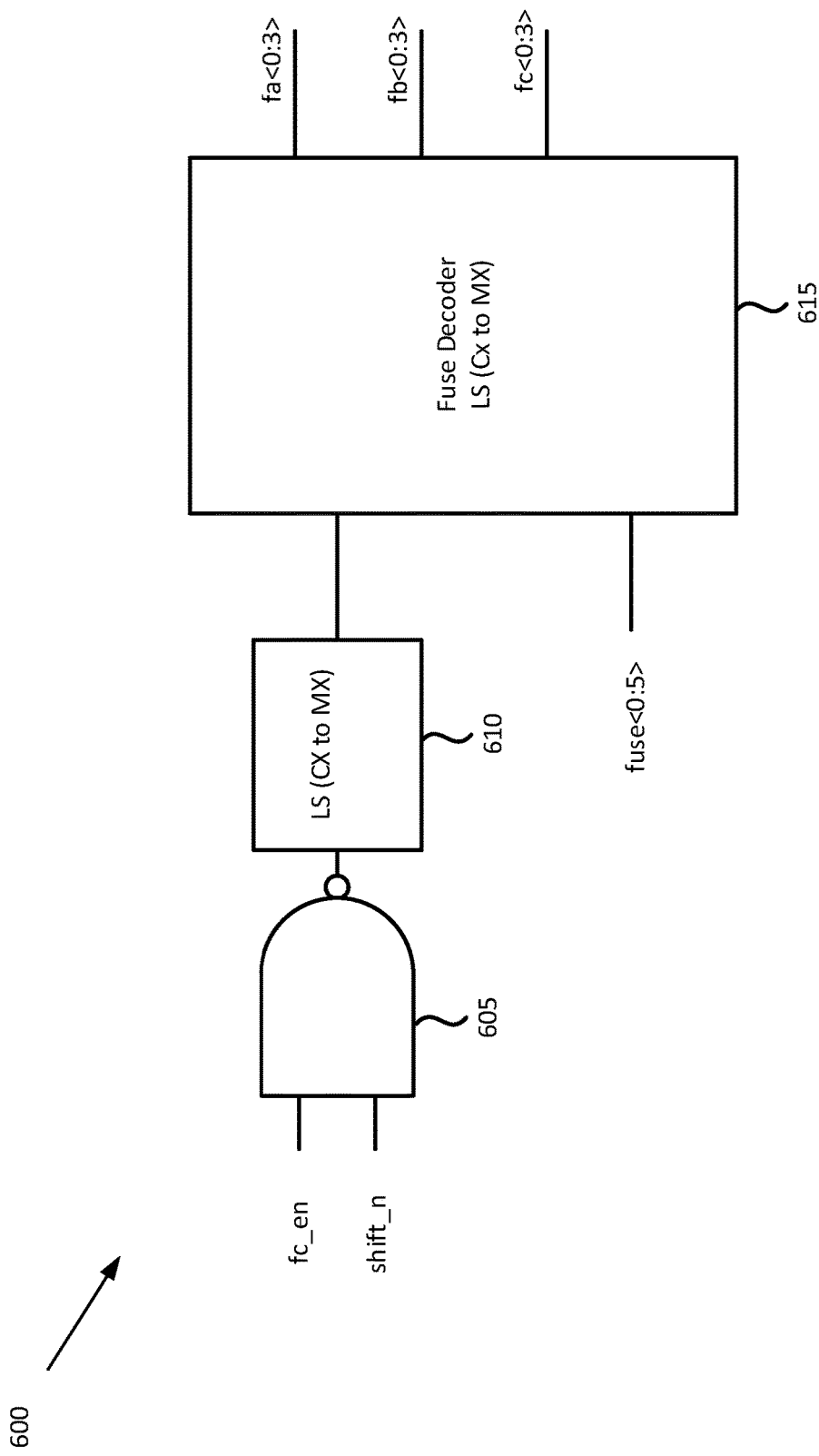
FIG. 6 illustrates a redundancy decoder for the memory of FIG. 1 in accordance with an aspect of the disclosure.

A redundancy decoder 600 shown in FIG. 6 advantageously allows the redundancy logic circuits such as discussed for FIGS. 1 and 2 to be tested by a scan mode of operation, including the detection of resistive path faults. When enabled during a scan mode of operation, redundancy decoder 600 decodes a fuse word fuse<0:5> to produce the three decoded redundancy address signals fa<0:3>, fb<0:3>, and fc<0:3>. The bit width of the fuse word as well as the number and bit width of the decoded redundancy address signals may be varied in alternative implementations. A gating logic gate such as a NAND gate 605 controls the enabling of the redundancy decoder 600. NAND gate 605 gates an active-low redundancy enable signal fc_en with an active-low gating signal (shift_n) signal that is asserted a known time prior to the assertion of a triggering edge of the scan clock signal for the DFT scan chain. The following discussion will assume that the triggering edge of the scan clock signal is a rising edge without loss of generality. When the shift_n signal discharged shortly before the assertion of the scan clock signal and with the redundancy enable signal fc_en already discharged, an output signal from NAND gate 605 is asserted. The asserted NAND gate output may then be level-shifted from the core (CX) power domain to the memory (MX) power domain by a level-shifter 610 to form a gated enable signal received at an enable input terminal of a fuse decoder 615. Fuse decoder 615 is configured to decode the fuse word fuse<0:5> into the decoded redundancy address signals fa<0:3>, fb<0:3>, and fc<0:3> when enabled by an assertion of the gated enable signal.

Referring again to memory 100, a scan chain flip-flop 105 registers the match_next signal from the zeroth redundancy logic circuit when clocked by the scan clock signal. Flip-flop 105 shifts out the sampled match_next signal as a redundancy scan out signal (red_scan_out). A timer (not illustrated) may then determine the delay between the discharge of the gating signal (shift_n) and the assertion of the redundancy scan out signal. Should this delay be greater than a threshold delay, a resistive path fault in the redundancy logic circuit is detected. For example; the scan may begin by testing the zeroth redundancy logic circuit. If the zeroth redundancy logic circuit asserts its match_next signal so that the threshold delay is not reached, the scan may continue to test the first redundancy logic circuit, and so on until the Nth redundancy logic circuit is finally tested.

Figure 7:
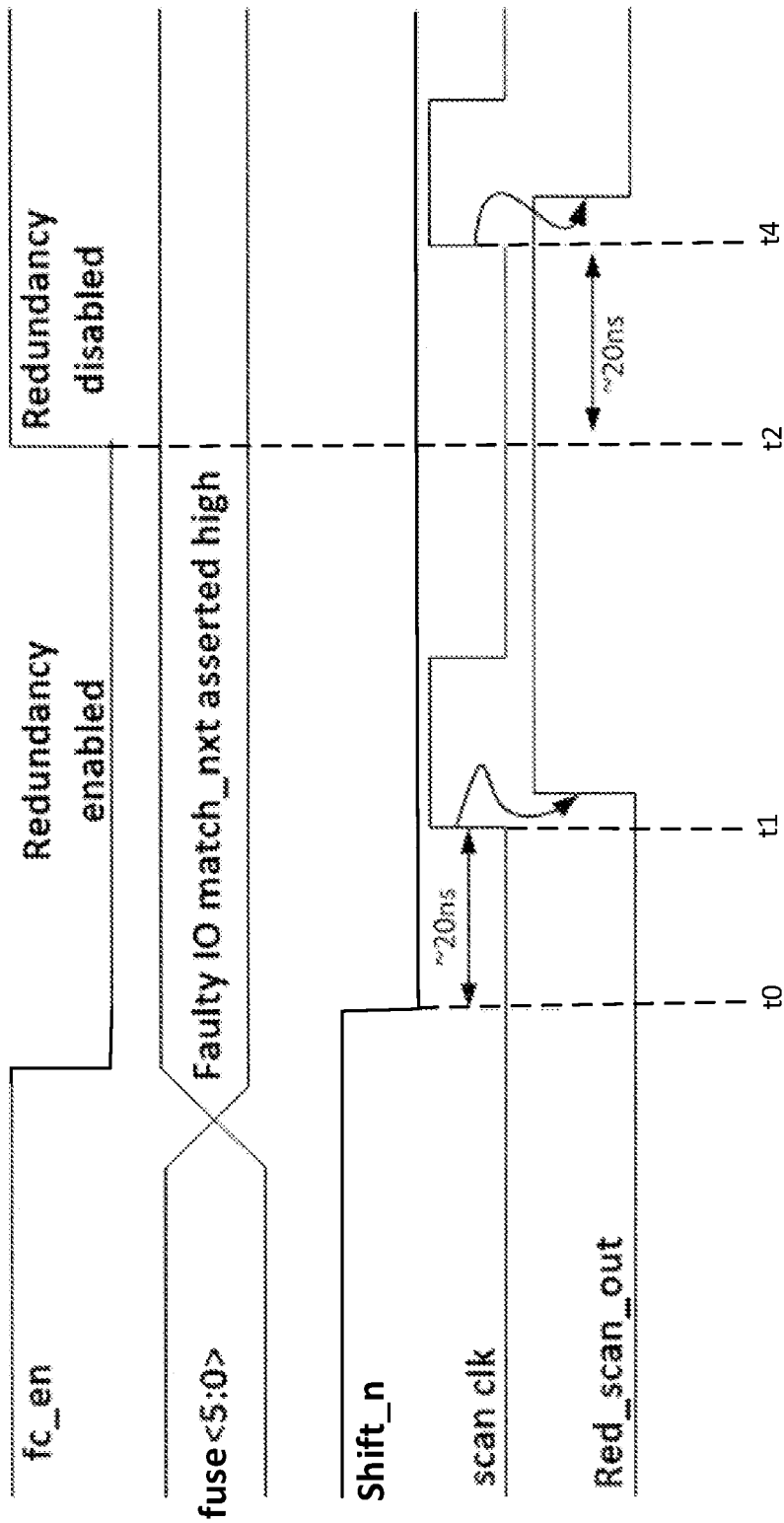
FIG. 7 illustrates a timing diagram of signals associated with the redundancy decoder of FIG. 6.

A timing diagram for the redundancy decoder signals fc_en, shift_n, the fuse word, the scan clock signal, and the redundancy scan out signal is shown in FIG. 7. Prior to a time t0, the fuse word fuse<5:0> is received at the redundancy decoder and the redundancy enable signal fc_en is asserted by being discharged in an active-low implementation. The fuse word is coded so that the addressed redundancy logic circuit should assert its match_next signal. To test whether this assertion of the match_next signal is subject to a resistive path delay, the active-low gating signal shift_n is not asserted by being discharged until a time to. The scan clock rising edge is not asserted until a time t1 approximately 20 ns later. In general, the delay between the shift_n and scan clock edges may be greater or smaller than 20 ns depending upon the distinction between a normal processing delay and a resistive path delay. Should the delay between the shift_n falling edge and the rising edge of the redundancy scan out signal (Red_scan_out) be excessive, a resistive path delay is deemed to be detected in the targeted redundancy logic circuit. The redundancy enable signal is then de-asserted by being charged to a power supply voltage at a time t2. This time may also be controlled to be a known time (e.g., 20 ns) before the next rising edge of the scan clock signal at a time t3 to determine whether the redundancy scan out signal is taking too long to be discharged.

Figure 8:
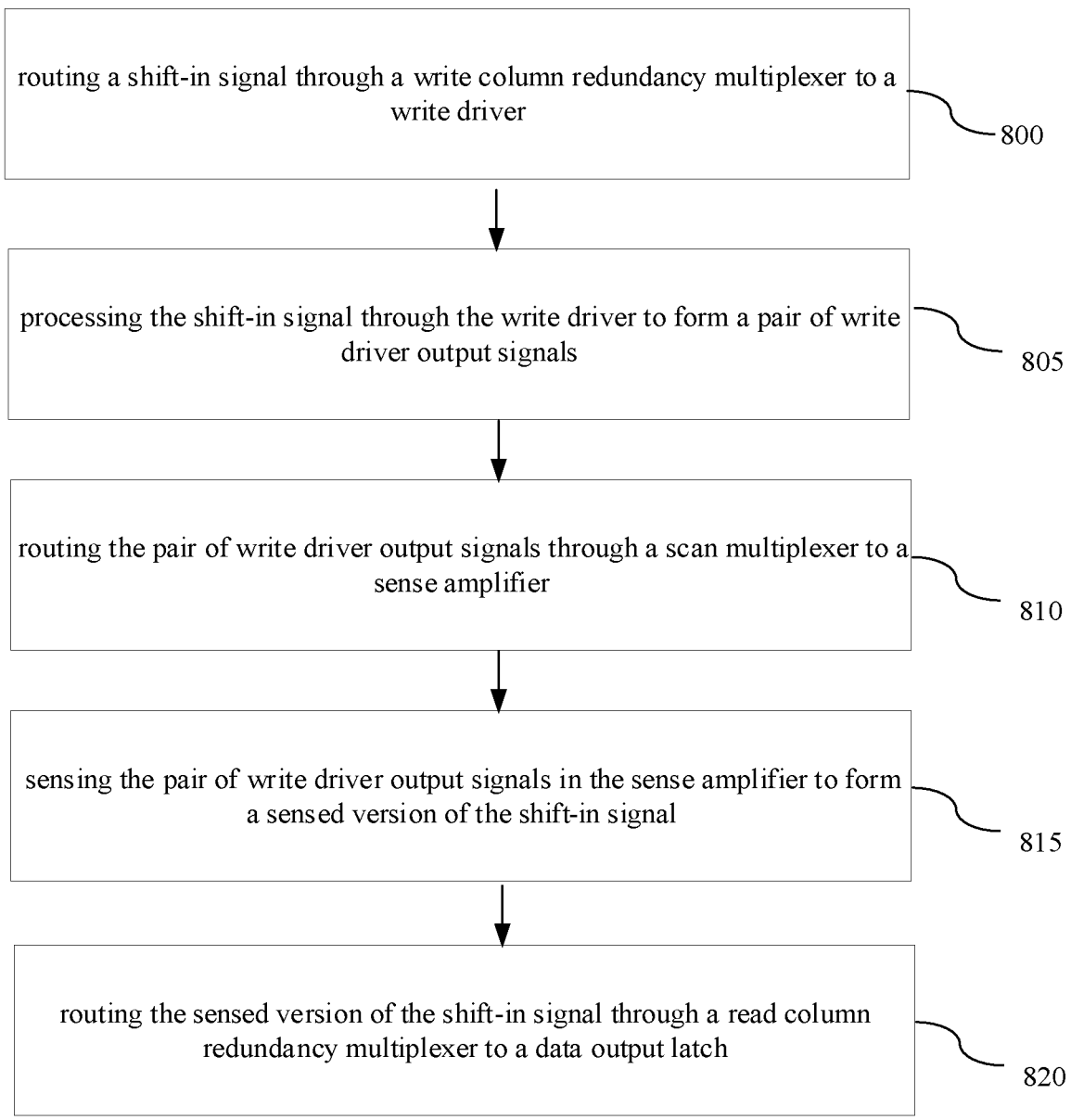
FIG. 8 is a flowchart for a method of scanning the redundancy multiplexers in a memory column in accordance with an aspect of the disclosure.

An example method of scanning the redundancy multiplexers in a column will now be discussed with reference to the flowchart of FIG. 8. The acts in this flowchart are responsive to a triggering edge of a scan clock signal during a scan mode of operation in which the column redundancy signal for the column is false. The method includes an act 800 of routing a shift-in signal through a write column redundancy multiplexer to a write driver. The routing of the shift-in signal through write column redundancy multiplexer 320 in column 400 is an example of act 800. The method also includes an act 805 of processing the shift-in signal through the write driver to form a pair of write driver output signals. The processing of the shift-in signal in write driver 325 in column 400 is an example of act 805. The method further includes an act 810 of routing the pair of write driver output signals through a scan multiplexer to a sense amplifier. The routing through scan multiplexer 405 in column 400 is an example of act 810. In addition, the method includes an act 815 of sensing the pair of write driver output signals in the sense amplifier to form a sensed version of the shift-in signal. The sensing in sense amplifier 330 in column 400 in an example of act 815. Finally, the method includes an act 820 of routing the sensed version of the shift-in signal through a read column redundancy multiplexer to a data output latch. The routing through read column redundancy multiplexer 410 in column 400 is an example of act 820.

The disclosure will now be summarized in the following example clauses:

Clause 1. A memory, comprising:
    a plurality of columns, each column including:
    a bit line;
    a complement bit line;
    a first read multiplexer transistor coupled to the bit line and having a read terminal;
    a second read multiplexer transistor coupled to the complement bit line and having a complement read terminal;
    a write driver having a write data output terminal and a complement write data output terminal;
    a scan multiplexer having a first pair of input terminals coupled to the write data output terminal and the complement write data output terminal and having a second pair of input terminals coupled to the read terminal and the complement read terminal; and
    a sense amplifier coupled to an output from the scan multiplexer.

Clause 2. The memory of clause 1, wherein the scan multiplexer is configured to select for the first pair of input terminals during a scan mode and to select for the second pair of input terminals during a read operation.

Clause 3. The memory of any of clauses 1-2, each column further comprising:
    a read column redundancy multiplexer having a first input terminal coupled to an output terminal of the sense amplifier and having a second input terminal coupled to an output terminal of a sense amplifier in an adjacent column.

Clause 4. The memory of clause 3, each column further comprising a data output latch having an input terminal coupled to an output terminal of the read column redundancy multiplexer.

Clause 5. The memory of any of clauses 3-4, wherein the read column redundancy multiplexer is configured to select for its first input terminal responsive to a column redundancy signal for the column being false and to select for its second input terminal responsive to the column redundancy signal being true.

Clause 6. The memory of any of clauses 1-5, each column further including:
    a write column redundancy multiplexer having a first output terminal coupled to an input terminal of the write driver and having a second output terminal coupled to a write driver in an adjacent column.

Clause 7. The memory of clause 6, each column further including:
a scan flip-flop, wherein the write column redundancy multiplexer includes an input terminal coupled to an output of the scan flip-flop.

Clause 8. The memory of clause 7, wherein the scan flip-flop includes a master latch and a slave latch.

Clause 9. The memory of any of clauses 1-8, wherein the first read multiplexer transistor and the second read multiplexer transistor each comprises a p-type-metal-oxide-semiconductor (PMOS) transistor.

Clause 10. The memory of clause 5, further comprising:
a plurality of redundancy logic circuits corresponding to the plurality of columns, each redundancy logic circuit being configured to process a plurality of decoded redundancy address bits to produce the column redundancy signal for the corresponding column.

Clause 11. The memory of clause 10, wherein each redundancy logic circuit includes a first logic gate configured to process the column redundancy signal from a preceding one of the redundancy logic circuits.

Clause 12. The memory of clause 11, wherein each first logic gate is a NOR gate.

Clause 13. The memory of clause 11, wherein each redundancy logic circuit further comprises a second logic gate configured to process the plurality of decoded redundancy address bits.

Clause 14. The memory of clause 13, wherein each second logic gate comprises a NAND gate.

Clause 15. The memory of any of clauses 1-14, further comprising:
a first write multiplexer transistor coupled between the bit line and the write data output terminal; and
a second write multiplexer transistor coupled between the complement bit line and the complement write data output terminal.

Clause 16. The memory of any of clauses 10-13, further comprising:
a redundancy decoder including:
a gating logic gate configured to process a column redundancy enable signal with a gating signal, wherein the redundancy decoder is configured to decode a fuse word responsive to an assertion of an output signal from the gating logic gate.

Clause 17. The memory of clause 16, wherein the gating logic gate comprises a NAND gate.

Clause 18. A method of testing a column in a memory, comprising:
in response to a column redundancy signal for the column being false during a scan mode of operation:
responsive to a triggering edge of a scan clock signal, routing a shift-in signal through a write column redundancy multiplexer to a write driver;
processing the shift-in signal through the write driver to form a pair of write driver output signals;
routing the pair of write driver output signals through a scan multiplexer to a sense amplifier;
sensing the pair of write driver output signals in the sense amplifier to form a sensed version of the shift-in signal; and
routing the sensed version of the shift-in signal through a read column redundancy multiplexer to a data output latch.

Clause 19. The method of clause 18, further comprising:
in response to the column redundancy signal for the column being true during the scan mode of operation:
routing the shift-in signal through the write column redundancy multiplexer to a first adjacent column; and
routing a sensed version of a shift-in signal from a second adjacent column through the read column redundancy multiplexer to the data output latch.

Clause 20. The method of any of clauses 18-19, further comprising:
asserting a gating signal at a gating delay prior to the triggering edge of a scan clock signal;
decoding a fuse word to form a plurality of decoded redundancy bits responsive to the asserting of the gating signal; and
processing the plurality of decoded redundancy bits to form the column redundancy signal.

Clause 21. A memory, comprising:
a plurality of columns, each column including:
a bit line;
a complement bit line;
a first read multiplexer transistor coupled to the bit line and having a read terminal;
a second read multiplexer transistor coupled to the complement bit line and having a complement read terminal;
a sense amplifier having a first input terminal coupled to the read terminal and a second input terminal coupled to the complement read terminal;
a read column redundancy multiplexer having a first input terminal coupled to an output terminal of the sense amplifier and having a second input terminal coupled to a sense amplifier in an adjacent column; and a data output latch having an input terminal coupled to an output terminal of the read column redundancy multiplexer through a direct electrical connection.

Clause 22. The memory of clause 21, wherein the read column redundancy multiplexer is configured to select for its first input terminal responsive to a column redundancy signal for the column being false and to select for its second input terminal responsive to the column redundancy signal being true.

Clause 23. The memory of any of clauses 21-22, each column further including:
a write driver; and
a write column redundancy multiplexer having a first output terminal coupled to an input terminal of the write driver and having a second output terminal coupled to a write driver in an adjacent column.

Clause 24. The memory of clause 23, each column further including:
a scan flip-flop, wherein the write column redundancy multiplexer includes an input terminal coupled to an output terminal of the scan flip-flop.

Clause 25. A memory, comprising:
a redundancy decoder including a gating logic gate and a fuse decoder having an enable input terminal coupled to an output terminal of the gating logic gate, the redundancy decoder further including a plurality of output terminals for a plurality of decoded address signals;
a plurality of column redundancy logic circuits arranged in series, each column redundancy logic circuit having a set of input terminals for receiving a respective set of redundancy address bits and having an output terminal for a column redundancy signal; and a scan flip-flop configured to latch the column redundancy signal from a last one of the column redundancy logic circuits.

Clause 26. The memory of clause 25, wherein the gating logic gate comprises a NAND gate.

Clause 27. The memory of any of clauses 25-26, wherein each redundancy logic circuit is configured to assert its column redundancy signal responsive to an assertion of the column redundancy signal from a preceding one of the redundancy logic circuits.

Clause 28. The memory of clause 26, wherein each redundancy logic circuit further includes a first logic gate configured to process the column redundancy signal from the preceding one of the redundancy logic circuits.

Clause 29. The memory of clause 28, wherein each redundancy logic circuit further includes a second logic gate configured to process the respective set of decoded redundancy address bits.

Clause 30. The memory of clause 29, wherein each first logic gate comprises a NOR gate and wherein each second logic gate comprises a NAND gate.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A memory, comprising:
a plurality of columns, each column including:
a bit line;
a complement bit line;
a first read multiplexer transistor coupled to the bit line and having a read terminal;
a second read multiplexer transistor coupled to the complement bit line and having a complement read terminal;
a write driver having a write data output terminal and a complement write data output terminal;
a scan multiplexer configured to respond to a scan mode signal to select between a first pair of input terminals coupled to the write data output terminal and the complement write data output terminal and a second pair of input terminals coupled to the read terminal and the complement read terminal; and
a sense amplifier coupled to an output from the scan multiplexer.

2. The memory of claim 1, wherein the scan multiplexer is configured to select for the first pair of input terminals during a scan mode and to select for the second pair of input terminals during a read operation.

3. The memory of claim 1, each column further comprising:
a read column redundancy multiplexer having a first input terminal coupled to an output terminal of the sense amplifier and having a second input terminal coupled to an output terminal of a sense amplifier in an adjacent column.

4. The memory of claim 3, each column further comprising a data output latch having an input terminal coupled to an output terminal of the read column redundancy multiplexer.

5. The memory of claim 4, wherein the read column redundancy multiplexer is configured to select for its first input terminal responsive to a column redundancy signal for the column being false and to select for its second input terminal responsive to the column redundancy signal being true.

6. The memory of claim 1, each column further including:
a write column redundancy multiplexer having a first output terminal coupled to an input terminal of the write driver and having a second output terminal coupled to a write driver in an adjacent column.

7. The memory of claim 6, each column further including:
a scan flip-flop, wherein the write column redundancy multiplexer includes an input terminal coupled to an output terminal of the scan flip-flop.

8. The memory of claim 7, wherein the scan flip-flop includes a master latch and a slave latch.

9. The memory of claim 1, wherein the first read multiplexer transistor and the second read multiplexer transistor each comprises a p-type-metal-oxide-semiconductor (PMOS) transistor.

10. The memory of claim 5, further comprising:
a plurality of redundancy logic circuits corresponding to the plurality of columns, each redundancy logic circuit being configured to process a plurality of decoded redundancy address bits to produce the column redundancy signal for the corresponding column.

11. The memory of claim 10, wherein each redundancy logic circuit includes a first logic gate configured to process the column redundancy signal from a preceding one of the redundancy logic circuits.

12. The memory of claim 11, wherein each first logic gate is a NOR gate.

13. The memory of claim 11, wherein each redundancy logic circuit further comprises a second logic gate configured to process the plurality of decoded redundancy address bits.

14. The memory of claim 13, wherein each second logic gate comprises a NAND gate.

15. The memory of claim 1, further comprising:
a first write multiplexer transistor coupled between the bit line and the write data output terminal; and
a second write multiplexer transistor coupled between the complement bit line and the complement write data output terminal.

16. The memory of claim 10, further comprising:
a redundancy decoder including:
a gating logic gate configured to process a column redundancy enable signal with a gating signal, wherein the redundancy decoder is configured to decode a fuse word responsive to an assertion of an output signal from the gating logic gate.

17. The memory of claim 16, wherein the gating logic gate comprises a NAND gate.

* * * * *